US008829935B2

(12) United States Patent
Sato (10) Patent No.: US 8,829,935 B2
(45) Date of Patent: Sep. 9, 2014

(54) TEST APPARATUS

(75) Inventor: Shusaku Sato, Saitama (JP)

(73) Assignee: Advantest Corporation, Tokyo (JP)

( * ) Notice: Subject to any disclaimer, the term of this patent is extended or adjusted under 35 U.S.C. 154(b) by 662 days.

(21) Appl. No.: 13/118,475

(22) Filed: May 30, 2011

(65) Prior Publication Data

US 2012/0133382 A1 May 31, 2012

Related U.S. Application Data

(63) Continuation of application No. PCT/JP2010/000044, filed on Jan. 6, 2010.

(30) Foreign Application Priority Data

Jan. 8, 2009 (JP) ................................. 2009-002944

(51) Int. Cl.
*G01R 31/20* (2006.01)
*G01R 31/28* (2006.01)
*G01R 1/067* (2006.01)

(52) U.S. Cl.
CPC ........ *G01R 31/2889* (2013.01); *G01R 1/06777* (2013.01)
USPC ................................. 324/754.07; 324/754.03

(58) Field of Classification Search
CPC ................. G01R 31/2889; G01R 1/06717
See application file for complete search history.

(56) References Cited

U.S. PATENT DOCUMENTS 7,471,092 B2 * 12/2008 Amanuma et al. ............ 324/522
2002/0067179 A1   6/2002 Takasugi et al.
2008/0290882 A1  11/2008 Rogers et al.

FOREIGN PATENT DOCUMENTS

JP          2007-205792 A       8/2007

OTHER PUBLICATIONS

English Translation of JP2007-205792 patent on Aug. 16, 2007.*
Office Action for Application No. 11 2010 000 706.3, issued by the German Patent Office on Dec. 5, 2013.

* cited by examiner

*Primary Examiner* — Jermele M Hollington (57) ABSTRACT

A test apparatus that test a device under test, comprising a test head that is arranged facing the device under test and that includes a test module for testing the device under test, and a probe assembly that transmits a signal and that is arranged between the test head and the device under test. The probe assembly includes a plurality of low voltage pins arranged at prescribed intervals from each other, and a plurality of high voltage pins that are arranged such that distance between each high voltage pin and each low voltage pin is greater than the prescribed interval, and that transmit a signal with a higher voltage than a signal transmitted by the low voltage pins. All of the high voltage pins are arranged in only one of two regions formed by dividing a surface of the probe assembly in half.

16 Claims, 6 Drawing Sheets

TEST APPARATUS

BACKGROUND

1. Technical Field

The present invention relates to a test apparatus.

2. Related Art

As a test apparatus for a semiconductor device or the like, an apparatus is known that has both a test function using a low voltage signal of 15 V and a test function using a high voltage signal of 2 kV, as shown in Patent Document 1, for example. These signals are transmitted to the semiconductor device via a probe substrate.

Patent Document 1: Japanese Patent Application Publication No. 2007-205792

In the probe substrate, however, the pins transmitting the high voltage signal must be arranged at a prescribed distance or farther from the pins transmitting the low voltage signal. Therefore, when the number of pins for high voltage is increased, the space in which the pins for low voltage can be arranged is limited, and a sufficient number of probe pins cannot be ensured on the probe substrate.

In a test apparatus generating such a high voltage signal, a test module that generates a signal can be provided at a distance from the semiconductor device. For example, a test head housing the test module and a prober on which the semiconductor device is mounted can be disposed at a distance from each other, and the test head and prober can be connected by a cable to transmit signals.

However, when the test head and the prober are connected by a relatively long cable, the resistance component, capacitance component, or the like of the cable degrade the accuracy of the test using the low voltage signal. In particular, the accuracy of tests using a signal with low voltage and high frequency is degraded. When the testing accuracy is low, the pass/fail judgment accuracy can be improved by repeating the test multiple times, but this lengthens the overall testing time.

Furthermore, when the high voltage signal travels through a long cable, the accuracy of a small current measurement is degraded by the insulation resistance of the cable of the connector, or the waveform thereof is degraded by the resistance component or capacitance component of the cable or the connector.

SUMMARY

Therefore, it is an object of an aspect of the innovations herein to provide a test apparatus, which are capable of overcoming the above drawbacks accompanying the related art. The above and other objects can be achieved by combinations described in the independent claims. According to a first aspect of the present invention, provided is a test apparatus that test a device under test, comprising a test head that is arranged facing the device under test and that includes a test module for testing the device under test, and a probe assembly that transmits a signal and that is arranged between the test head and the device under test. The probe assembly includes a plurality of low voltage pins arranged at prescribed intervals from each other, and a plurality of high voltage pins that are arranged such that distance between each high voltage pin and each low voltage pin is greater than the prescribed interval, and that transmit a signal with a higher voltage than a signal transmitted by the low voltage pins. All of the high voltage pins are arranged in only one of two regions formed by dividing a surface of the probe assembly in half.

The summary clause does not necessarily describe all necessary features of the embodiments of the present invention. The present invention may also be a sub-combination of the features described above.

DESCRIPTION OF EXEMPLARY EMBODIMENTS

Hereinafter, an embodiment of the present invention will be described. The embodiment does not limit the invention according to the claims, and all the combinations of the features described in the embodiment are not necessarily essential to means provided by aspects of the invention.

Figure 1:
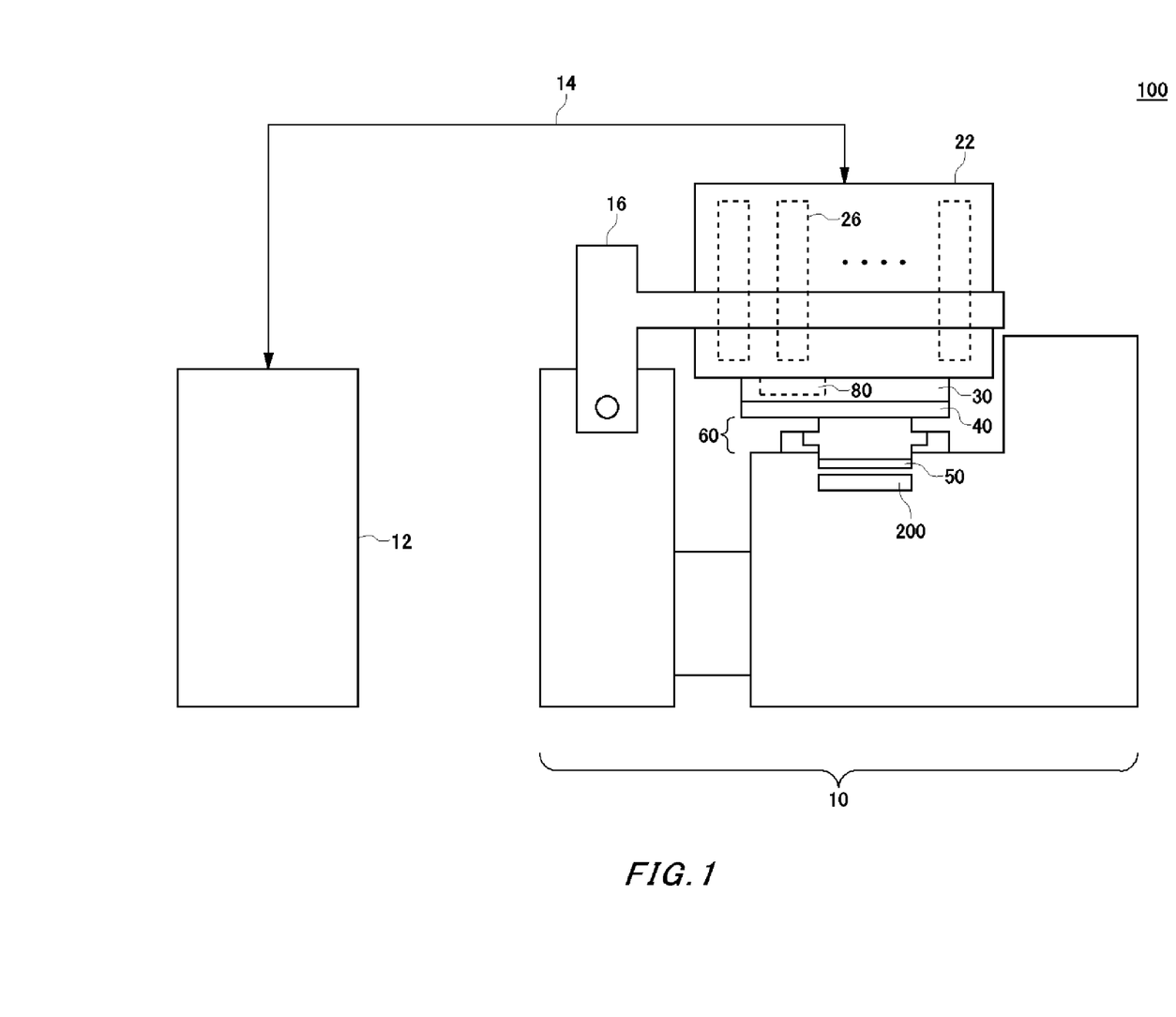
FIG. 1 shows an overview of a test apparatus 100 according to an embodiment of the present invention.

FIG. 1 shows an overview of a test apparatus 100 according to an embodiment of the present invention. The test apparatus 100 tests a device under test 200 such as a semiconductor device, and includes a prober 10, a mainframe 12, a cable 14, a driving section 16, a test head 22, a frame 30, a high voltage module 80, a performance board 40, a probe assembly 60, and a probe card 50. The device under test 200 may be a device formed on a wafer. The device under test 200 may be a SOC device.

The prober 10 may have a device under test 200 mounted thereon at a prescribed position. The prober 10 may have a plurality of devices under test 200 mounted thereon. The probe card 50 is arranged facing the device under test 200 mounted on the prober 10, and is electrically connected to the device under test 200. The probe card 50 is fixed to the test head 22 via the probe assembly 60, the performance board 40, the frame 30, and the switching section 24. The performance board 40 and the frame 30 are formed integrally by a screw or the like. As a result, the strength of the performance board 40 can be improved.

The driving section 16 moves the test head 22. For example, when testing the device under test 200, the driving section 16 may connect the probe card 50 to the device under test 200 by moving the test head 22 to a position facing the device under test 200, as shown in FIG. 1.

Figure 2:
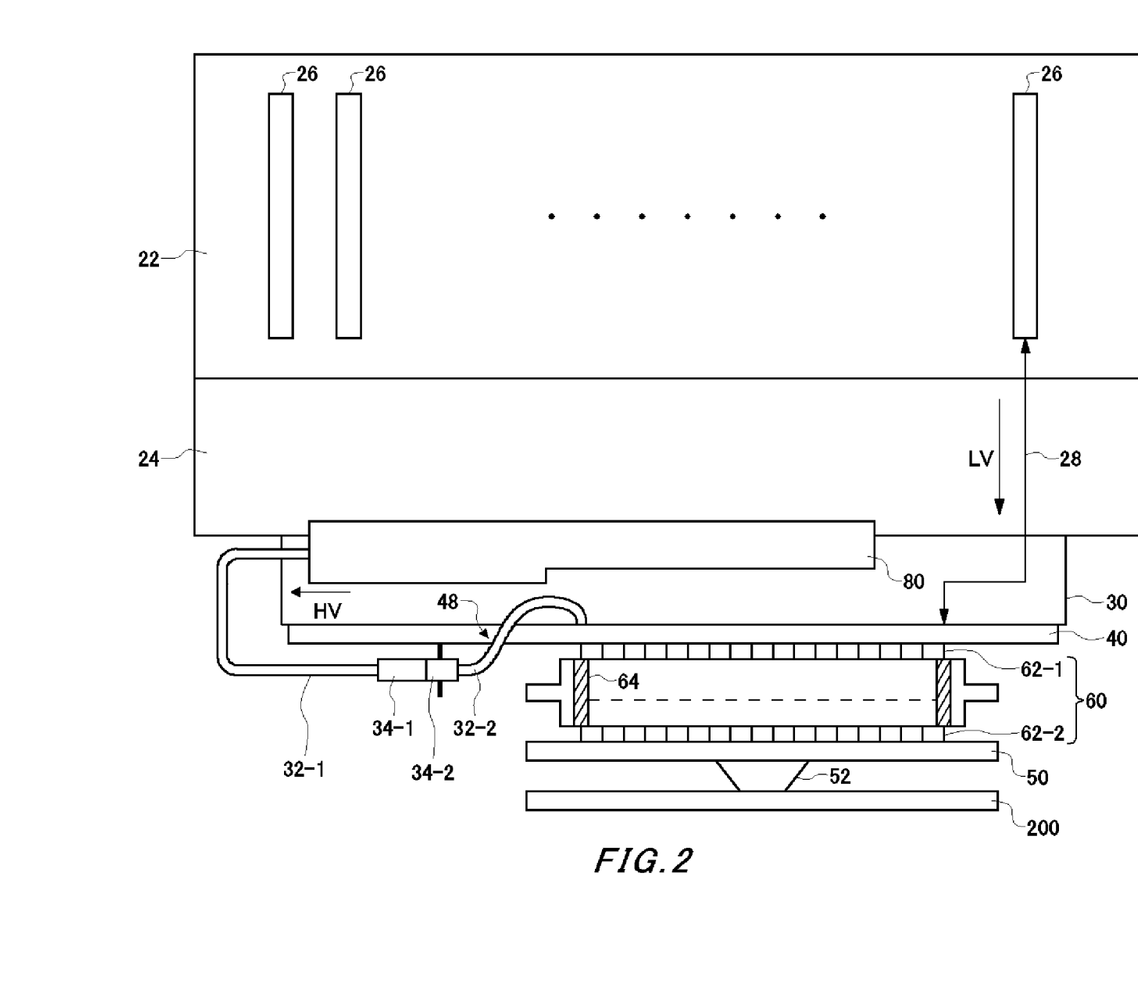
FIG. 2 is an enlarged view of the structure from the test head 22 to the probe card 50.

The test head 22 is arranged facing the device under test 200. The test head 22 houses the test module 26 that performs low voltage testing on the device under test 200. The switching section 24 shown in FIG. 2 is disposed on the surface of the test head 22. The high voltage module 80 that performs testing with a higher voltage than the test module 26 is fixed to the switching section 24 by a screw or the like. As a result, the high voltage module 80 is fixed to the test head 22.

The high voltage module 80 may be a module that can generate a signal with a higher voltage than the test module 26. For example, the test module 26 may be capable of generating a signal from 0 V to 20 V, and the high voltage module 80 may be capable of generating a signal from 0 V to 2 kV. The high voltage module 80 may be capable of generating a voltage corresponding to the withstand voltage specifications of the device under test 200, in order to test the withstand voltage of the device under test 200.

The high voltage module 80 may be disposed on the surface of the switching section 24 facing the device under test 200. The mainframe 12 tests the device under test 200 by controlling these modules via the cable 14.

The frame 30 is fixed to the surface of the switching section 24 facing the device under test 200. The frame 30 may be fixed integrally to the performance board 40, such that the performance board 40 is held in position facing the device under test 200.

The performance board 40 is arranged between the device under test 200 and the switching section 24. More specifically, the performance board 40 is arranged between the probe assembly 60 and the frame 30.

The probe assembly 60 is arranged between the device under test 200 and the performance board 40. More specifically, the probe assembly 60 is arranged between the probe card 50 and the performance board 40 and is electrically connected to the probe card 50 and the performance board 40. With this configuration, the test head 22 is electrically connected to the device under test 200 via the probe card 50 and can perform high voltage testing and low voltage testing on the device under test 200. The test module 26 is arranged near the device under test 200, and therefore the device under test 200 can be accurately tested without repeating the low voltage testing. Therefore, the testing time can be shortened.

FIG. 2 is an enlarged view of the structure from the test head 22 to the probe card 50. The test apparatus 100 in this example further includes a switching section 24 between the test head 22 and the frame 30. The frame 30 is detachably disposed on the switching section 24. The high voltage module 80 is fixed to the test head 22 via the switching section 24, by a screw or the like. The test head 22 houses a plurality of test modules 26. The switching section 24 switches which pin of the device under test 200 each test module 26 is connected to, by switching the transmission path 28 used by each test module 26 for transmission through the switching section 24. The switching section 24 may include a housing section that houses a plurality of transmission paths 28 and a plurality of switches.

The high voltage module 80 is fixed to the surface of the switching section 24 facing the device under test 200. The frame 30 may be a cylinder having one opening formed in the switching section 24 side thereof and another opening formed in the performance board 40 side thereof. As described above, the frame 30 may be formed integrally with the performance board 40. The high voltage module 80 may be arranged on the surface of the switching section 24 in a region surrounded by the frame 30. The outer walls of the high voltage module 80 preferably have a withstand voltage that is higher than the voltage generated by the high voltage module 80.

The low voltage signal is transmitted between the test module 26 and the probe assembly 60, via the pattern wiring of the transmission paths 28 and the performance board 40. The transmission paths 28 may pass through the inner walls of the frame 30 to be electrically connected to the performance board 40. The transmission paths 28 may include spring pins providing connections between the switching section 24 and the performance board 40.

The high voltage signal is transmitted between the high voltage module 80 and the probe assembly 60 through vias in the withstand voltage cable 32, the withstand voltage connector 34, and the performance board 40. The withstand voltage of the withstand voltage cable 32 and the withstand voltage connector 34 is preferably higher than the voltage generated by the high voltage module 80. The low voltage signal and the high voltage signal may be analog signals, digital signals, or supply power, for example.

The performance board 40 transmits the received low voltage signal through the pattern wiring, the vias, and electrodes. The performance board 40 transmits the received high voltage signal through the vias. The withstand voltage cable 32 may be soldered to via electrodes of the performance board 40. The high voltage signal is preferably transmitted without passing through the pattern wiring of the performance board 40.

In the performance board 40, the via electrodes connected to the withstand voltage cable 32 are disposed at a creepage distance, corresponding to the maximum voltage level generated by the high voltage module 80, from the via electrodes, the pattern wiring, and other elements that transmit the low voltage signal. For example, the via electrodes for high voltage may be disposed at a creepage distance of approximately 1 mm for every 100 V generated by the high voltage module 80. In other words, if the maximum voltage generated by the high voltage module 80 is 1500 V, the via electrodes for high voltage are disposed at a creepage distance between approximately 15 mm and 16 mm from the via electrodes, pattern wiring, and other elements used for the low voltage signal.

A plurality of pins 62 that contact the electrodes of the probe card 50 and the performance board 40 are disposed respectively on the surfaces of the probe assembly 60 facing the probe card 50 and the performance board 40. The pins 62 may be spring pins, for example. The probe assembly 60 is connected to both the low voltage signal electrodes and the high voltage signal electrodes of the performance board 40.

Each pin 62-1 of the probe assembly 60 is connected to a corresponding pin 62-2 on the opposite surface of the probe assembly 60, through a via 64. With this structure, the probe assembly 60 can transmit the low voltage signal between the test module 26 and the probe card 50 and the high voltage signal between the high voltage module 80 and the probe card 50, in parallel. In the probe assembly 60 as well, the pins 62 transmitting the high voltage signal are disposed at a creepage distance, corresponding to the maximum voltage level generated by the high voltage module 80, from the pins 62 that transmit the low voltage signal.

With this structure, the high voltage signal can be transmitted between the high voltage module 80 and the probe card 50 while ensuring the withstand voltage. Therefore, even in a test apparatus using the probe assembly 60 and the probe card 50 in which the test head 22 is arranged near the device under test 200, the high voltage module 80 can be disposed in the test head 22. As a result, high voltage testing and highly accurate low voltage testing can both be realized.

The probe card 50 can be disposed between the probe assembly 60 and the device under test 200 to transmit the low voltage signal and the high voltage signal in parallel. The probe card 50 includes a probe pin 52 that is electrically connected to a terminal of the device under test 200. In the same manner as the performance board 40 and the probe assembly 60, the withstand voltage of the signal paths transmitting the high voltage signal in the probe card 50 is preferably ensured.

In the test apparatus 100, the performance board 40, the probe assembly 60, and the probe card 50 are preferably exchangeable. For example, as described above, the signal pins 62 for low voltage are preferably not disposed around the signal pins 62 for high voltage of the probe assembly 60. Therefore, it is possible that sufficient space for arranging the low voltage signal pins 62 cannot be ensured in the probe assembly 60 corresponding to both high voltage testing and low voltage testing. The performance board 40 can have the same problem. In such a case, the component with insufficient space can be exchanged, with a performance board 40 specialized for low voltage testing, for example.

The test apparatus 100 of the present embodiment connects the high voltage module 80 and the performance board 40 to each other via a withstand voltage connector 34. Therefore, by disconnecting the withstand voltage connector 34, the performance board 40 or the like can be exchanged. The withstand voltage connector 34 is fixed to the surface of the performance board 40 facing the probe assembly 60.

The withstand voltage cable 32 includes a module-side cable 32-1 and a board-side cable 32-2. The module-side cable 32-1 is electrically connected to the high voltage module 80. The board-side cable 32-2 is electrically connected to the probe assembly 60 via the performance board 40.

The withstand voltage connector 34 includes a module-side connector 34-1 and a board-side connector 34-2. The module-side connector 34-1 is disposed without being fixed to the frame 30, is electrically connected to the module-side cable 32-1, and engages with the board-side connector 34-2. The board-side connector 34-2 is fixed to the performance board 40 and is electrically connected to the board-side cable 32-2. With this structure, the withstand voltage connector 34 can be fixed to the performance board 40 and the performance board 40 can be attached and detached.

Since the region surrounded by the frame 30 is small, the withstand voltage connector 34 is preferably fixed on the probe assembly 60 side of the performance board 40. In this case, the module-side cable 32-1 may be electrically connected to the high voltage module via through-holes formed in the side of the frame 30.

The board-side cable 32-2 may pass through the through-hole 48 formed in the performance board 40 to directly connect to the via electrodes on the test head 22 side surface of the performance board 40. As a result, the high voltage signal can be transmitted without using the pattern wiring in the performance board 40.

As shown in FIG. 2, the probe assembly 60 and the probe card 50 may be arranged at a position skewed form the center of the performance board 40. The withstand voltage cable 32, the withstand voltage connector 34, and the through-hole 48 may be arranged on the surface of the performance board 40 at positions where the probe assembly 60 and the probe card 50 are not arranged.

Figure 3:
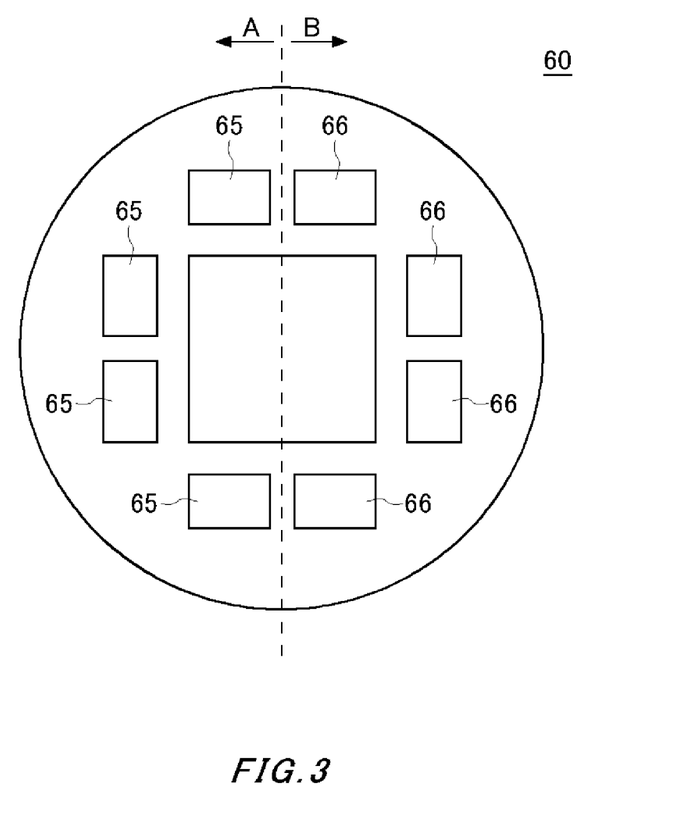
FIG. 3 is an exemplary top view of the probe assembly 60 as seen from the device under test 200 side.

FIG. 3 is an exemplary top view of the probe assembly 60 as seen from the device under test 200 side. A plurality of low voltage pin areas 65 and a plurality of high voltage pin areas 66 are disposed on the probe assembly 60. A plurality of low voltage pins that transmit the low voltage signal are arranged in each low voltage pin area 65. The low voltage signal may be approximately 15 V, for example, and may be generated by the test module 26. In other words, the low voltage pins in each low voltage pin area 65 may transmit signals to and from the test module 26.

A plurality of high voltage pins that transmit the high voltage signal are arranged in each high voltage pin area 66. The high voltage signal may be approximately 1500 V, for example, and may be generated by the high voltage module 80. In other words, the high voltage pins in each high voltage pin area 66 may transmit signals to and from the high voltage module 80. High voltage pins that transmit the high voltage signal are not arranged in the low voltage pin areas 65. Both low voltage pins and high voltage pins may be arranged in the high voltage pin areas 66.

As shown in FIG. 3, when the probe assembly 60 is divided into two regions, all of the low voltage pin areas 65 are preferably formed in one of the regions, e.g. region A, while all of the high voltage pin areas 66 are preferably arranged in the other region, e.g. region B. In other words, all of the high voltage pins are arranged in one of region A and region B. In the present embodiment, region A and region B are regions obtained by dividing the surface of the probe assembly 60 in half.

As described above, the high voltage pins are preferably arranged at a prescribed creepage distance from the low voltage pins, and therefore the pins can be efficiently arranged by gathering the high voltage pins in one region. Furthermore, the number of low voltage pin areas 65 and high voltage pin areas 66 disposed may correspond to the number of devices under test 200 to be tested simultaneously.

Figure 4:
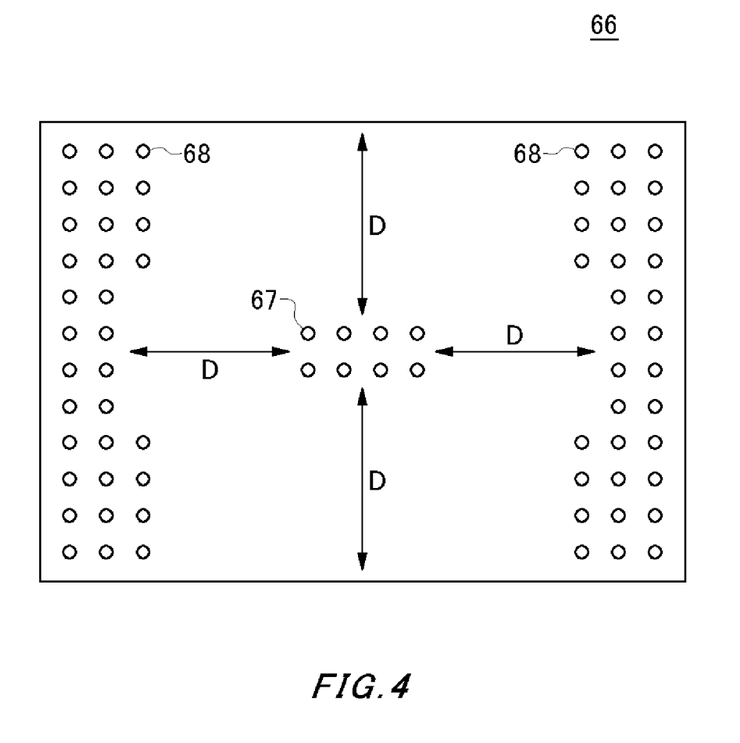
FIG. 4 shows an exemplary pin arrangement of a high voltage pin area 66.

FIG. 4 shows an exemplary pin arrangement in a high voltage pin area 66. In the high voltage pin area 66 of the present embodiment, a plurality of low voltage pins 68 and a plurality of high voltage pins 67 are arranged. The low voltage pins 68 are arranged at prescribed constant intervals d from each other. The low voltage pins 68 are arranged at these intervals in the low voltage pin areas 65 as well. The low voltage pins 68 are arranged in the high voltage pin area 66 as well, and so the low voltage pins 68 are in both region A and region B.

As shown in FIG. 4, the high voltage pins 67 are preferably arranged in the substantial center of the high voltage pin area 66, such that the high voltage pins 67 are kept at a prescribed creepage distance D from the low voltage pins 68. The substantial center of the high voltage pin area 66 refers to positions at which the distance between each high voltage pin 67 and each low voltage pin 68 is greater than or equal to the prescribed creepage distance D. The creepage distance D is greater than each of the constant intervals at which the low voltage pins 68 are arranged. For example, the low voltage pins 68 may be arranged at the periphery of the high voltage pin area 66, on a condition that the creepage distance D is maintained between the low voltage pins 68 and the high voltage pin areas 66. Ground pins or connection confirmation pins may be provided as the low voltage pins 68, for example.

The creepage distance D may be approximately 1 mm for every 100 V of the maximum voltage generated by the high voltage module 80. In other words, if the maximum voltage generated by the high voltage module 80 is 1500 V, the creepage distance is between approximately 15 mm and 16 mm. The intervals d between the low voltage pins 68 may be approximately 1 mm, for example.

Each high voltage pin 67 may be arranged such that the distance to at least one other high voltage pin 67 is d. In other words, the arrangement of high voltage pins 67 with respect to each other may be the same as the arrangement of low voltage pins 68 with respect to each other. By arranging the high voltage pins 67 together, the pins can be efficiently arranged on the probe assembly having a prescribed area.

Figure 5:
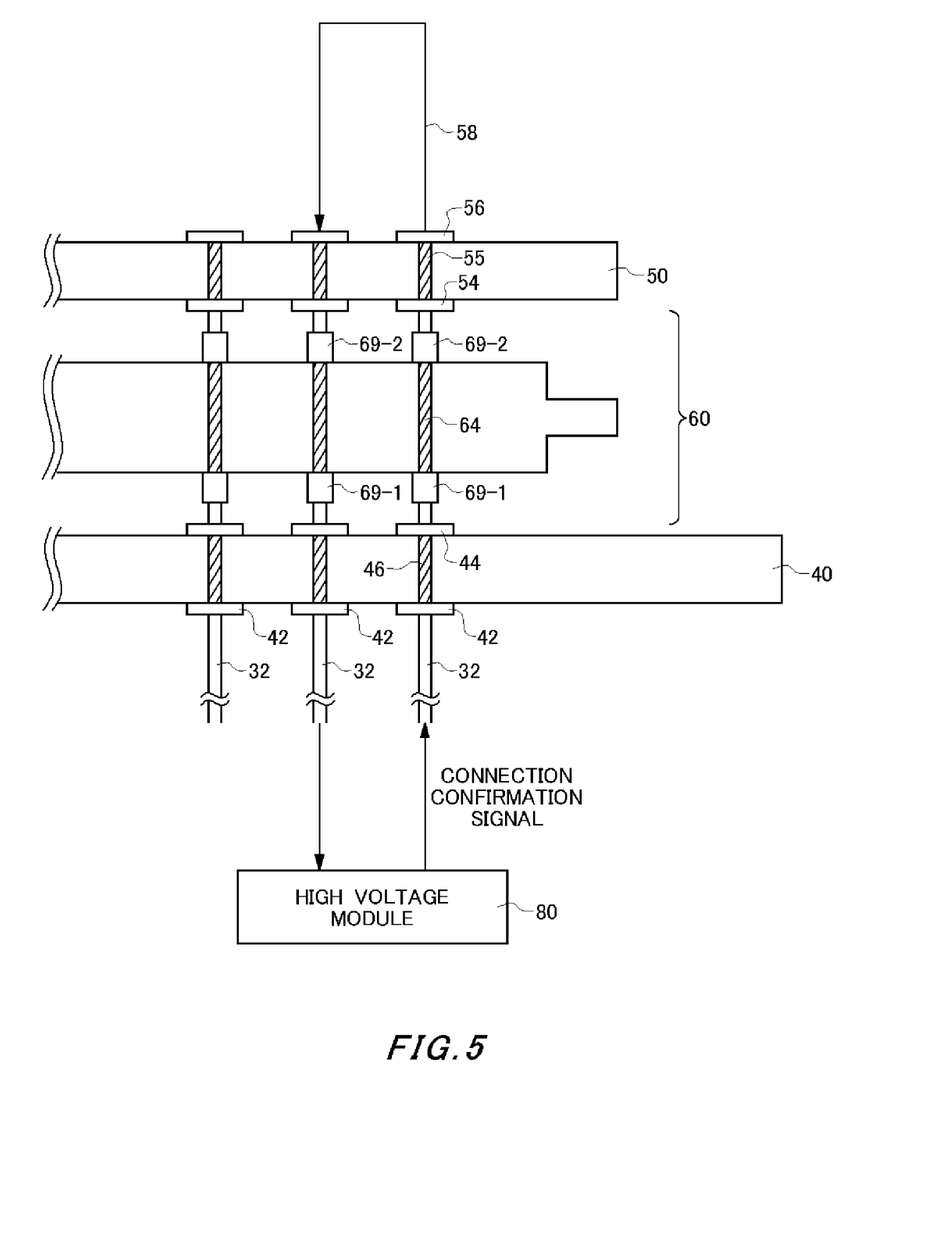
FIG. 5 is used to describe a configuration for confirming connection from the high voltage module 80 to the probe card 50.

FIG. 5 is used to describe a configuration for confirming connection from the high voltage module 80 to the probe card 50. As described above, a plurality of electrodes 42 connected to a plurality of withstand voltage cables 32 are disposed on the performance board 40. Each electrode 42 is electrically connected to a corresponding electrode 54 disposed on the probe card 50, via the probe assembly 60. More specifically, each electrode 42 is connected to an electrode 44 on the opposite surface of the performance board 40, through a via 46. The electrodes 44 are connected to connection confirmation pins 69-1 of the probe assembly 60. The connection confirmation pins 69-1 may be disposed on the periphery of the high voltage pin area 66.

The connection confirmation pins 69-1 are connected to connection confirmation pins 69-2 on the opposite surface of the probe assembly 60, through vias 64. The connection confirmation pins 69-2 are connected to the electrodes 54 of the probe card 50. The electrodes 54 are connected to electrodes 56 on the opposite surface of the probe card 50, through vias 55.

The probe card 50 includes pattern wiring 58 for electrically connecting pairs of electrodes 56 to each other. By connecting a pair of electrodes 56, a loop-back path is formed that loops a signal supplied to the performance board 40 back to the performance board 40 through the probe assembly 60 and the probe card 50.

The high voltage module 80 outputs a connection confirmation signal to the loop-back path from a prescribed electrode 42 of the performance board 40, and begins high voltage testing on a condition that the connection confirmation signal is looped back from the corresponding electrode 42. With this structure, the high voltage testing can be safely performed.

Figure 6:
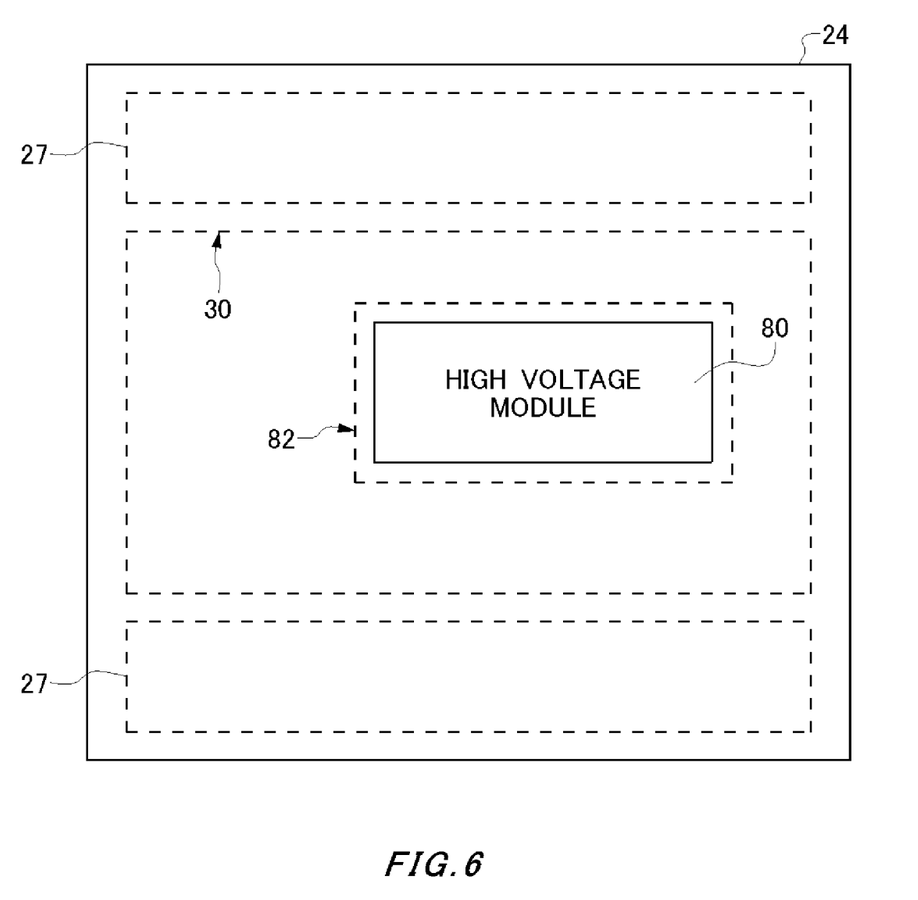
FIG. 6 shows an exemplary top view of the switching section 24 as seen from the device under test 200 side.

FIG. 6 shows an exemplary top view of the switching section 24 as seen from the device under test 200 side. As described above, the frame 30 and the performance board 40 are integrally fixed on the top surface of the switching section 24. The frame 30 may be disposed along the edges of the switching section 24. The high voltage module 80 is arranged in the region surrounded by the frame 30.

Here, an indentation 82 is preferably formed on the surface of the switching section 24 in the region where the high voltage module 80 is disposed. In this way, a larger high voltage module 80 can be provided. Furthermore, the transmission paths 28 described above may pass through the regions 27 within the walls of the frame 30.

While an embodiment of the present invention has been described, the technical scope of the invention is not limited to the above described embodiment. It is apparent to persons skilled in the art that various alterations and improvements can be added to the above-described embodiment. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A test apparatus that test a device under test, comprising:
  a test head that is arranged facing the device under test and that includes a test module for testing the device under test; and
  a probe assembly that transmits a signal and that is arranged between the test head and the device under test, wherein
  the probe assembly includes:
  a plurality of low voltage pins arranged at prescribed intervals from each other; and
  a plurality of high voltage pins that transmit a signal with a higher voltage than a signal transmitted by the low voltage pins, and
  all of the high voltage pins are arranged in only a first region of two regions formed by dividing a surface of the probe assembly in half, and a second region of the two regions only includes the plurality of low voltage pins.

2. The test apparatus according to claim 1, wherein
  the high voltage pins are arranged such that distance between each high voltage pin and each low voltage pin is greater than the prescribed interval.

3. The test apparatus according to claim 2, wherein
  each high voltage pin is arranged such that distance between the high voltage pin and at least one other high voltage pin is the prescribed interval.

4. The test apparatus according to claim 2, wherein
  the low voltage pins are arranged in both of the two regions obtained by dividing the surface of the probe assembly in half.

5. The test apparatus according to claim 3, wherein
  a high voltage pin area, in which the high voltage pins and the low voltage pins are arranged, is provided on the surface of the probe assembly, and
  in the high voltage pin area, the high voltage pins are arranged in a substantial center and the low voltage pins are arranged at a periphery.

6. The test apparatus according to claim 5, wherein
  a plurality of the high voltage pin areas are disposed in one of the two regions formed by dividing the probe assembly in half.

7. The test apparatus according to claim 3, wherein
  the test head includes a low voltage module that performs low voltage testing on the device under test by outputting a low voltage signal and a high voltage module that performs high voltage testing on the device under test by outputting a high voltage signal whose voltage is higher than voltage of the low voltage signal, and
  the high voltage pins are connected to the high voltage module.

8. The test apparatus according to claim 7, further comprising a performance board that is arranged between the device under test and the test head and transmits signals between the test module and the device under test, wherein
  the probe assembly is arranged between the device under test and the performance board.

9. The test apparatus according to claim 8, wherein
  the high voltage module and the probe assembly are electrically connected to each other via a withstand voltage cable, and
  the test module and the probe assembly are electrically connected to each other via pattern wiring in the performance board.

10. The test apparatus according to claim 9, wherein
  the withstand voltage cable electrically connects the high voltage module and the probe assembly via a withstand voltage connector fixed to the performance board.

11. The test apparatus according to claim 10, wherein
  the withstand voltage cable includes:
  a board-side cable that is electrically connected to the performance board; and
  a module-side cable that is electrically connected to the high voltage module, and
  the withstand voltage connector includes:
  a board-side connector that is fixed to the performance board and electrically connected to the board-side cable; and
  a module-side connector that is disposed without being fixed to the performance board, is electrically connected to the module-side cable, and engages with the board-side connector.

12. The test apparatus according to claim 11, wherein
the module-side cable is electrically connected to the high voltage module through a through-hole formed in a side surface of a frame formed integrally with the performance board.

13. The test apparatus according to claim 12, wherein
the high voltage module is disposed on a surface of the test head facing the performance board.

14. The test apparatus according to claim 13, further comprising a frame that is provided on the surface of the test head and on which the performance board is mounted, wherein
the high voltage module is provided on the surface of the test head in a region surrounded by the frame.

15. The test apparatus according to claim 14, wherein
an indentation is formed in the surface of the test head in a region where the high voltage module is disposed.

16. The test apparatus according to claim 11, further comprising a probe card that has disposed thereon a probe pin contacting the device under test and that transmits signals between the probe assembly and the device under test, wherein
the performance board has disposed thereon a plurality of electrodes connected to a plurality of the withstand voltage cables,
each electrode of the performance board is electrically connected to a corresponding electrode disposed on the probe card, via the probe assembly,
pattern wiring is disposed on the probe card to form a loop-back path that loops a signal supplied to the performance board back to the performance board via the probe assembly and the probe card by electrically connecting two electrodes of the probe card to each other, and
the high voltage module outputs a connection confirmation signal from the performance board to the loop-back path, and starts high voltage testing on a condition that the connection confirmation signal is looped back.

* * * * *